US008536467B2

(12) United States Patent
Miyashita et al.

(10) Patent No.: US 8,536,467 B2
(45) Date of Patent: Sep. 17, 2013

(54) CONNECTING STRUCTURE FOR ELECTRIC CABLES AND ELECTRIC APPARATUS

(75) Inventors: Toshihito Miyashita, Nagano (JP); Hiroshi Hioki, Nagano (JP); Masakazu Chikyu, Nagano (JP)

(73) Assignee: Sanyo Denki Co., Ltd., Tokyo (JP)

( * ) Notice: Subject to any disclaimer, the term of this patent is extended or adjusted under 35 U.S.C. 154(b) by 138 days.

(21) Appl. No.: 13/034,968

(22) Filed: Feb. 25, 2011

(65) Prior Publication Data

US 2011/0209914 A1 Sep. 1, 2011

(30) Foreign Application Priority Data

Feb. 26, 2010 (JP) ................................ 2010-042616
Feb. 7, 2011 (JP) ................................ 2011-023576

(51) Int. Cl.
*H05K 5/00* (2006.01)

(52) U.S. Cl.
USPC ............... 174/520; 174/59; 174/60; 439/527; 361/600

(58) Field of Classification Search
USPC ............... 174/520, 559, 53, 59, 60, 549, 551; 361/600–837; 439/527, 55, 65; 310/71
See application file for complete search history.

(56) References Cited

U.S. PATENT DOCUMENTS 3,012,159 A 12/1961 Druesedow
4,727,274 A * 2/1988 Adam et al. .................. 310/239
4,851,725 A 7/1989 Keck
5,015,894 A 5/1991 Crow et al.
5,073,735 A * 12/1991 Takagi ............................ 310/71
5,087,497 A 2/1992 Suzuki et al.
5,126,608 A * 6/1992 Sogabe et al. .................. 310/71
5,192,888 A 3/1993 Fleer
5,777,409 A 7/1998 Keck
5,885,102 A * 3/1999 Harting et al. ................ 439/527
6,290,528 B1 9/2001 Moore, Jr. et al.
6,528,914 B2 * 3/2003 Kloeppel et al. ................ 310/71
6,903,473 B2 * 6/2005 Matsuyama et al. ............ 310/71
7,270,577 B2 * 9/2007 Yang et al. .................... 439/638
2002/0117919 A1 8/2002 Williams et al.
2002/0140304 A1 10/2002 Dreher et al.
2004/0061391 A1 4/2004 Matsuyama et al.
2006/0040528 A1 2/2006 Yang et al.

FOREIGN PATENT DOCUMENTS

| | | |
|---|---|---|
| DE | 8914027 | 1/1990 |
| EP | 0213863 | 3/1987 |
| EP | 0688088 | 5/1995 |
| EP | 2023466 | 2/2009 |
| GB | 2201301 | 8/1988 |
| JP | 55-125051 | 9/1980 |

(Continued)

*Primary Examiner* — Angel R Estrada
*Assistant Examiner* — Dimary Lopez
(74) *Attorney, Agent, or Firm* — Rankin, Hill & Clark LLP

(57) ABSTRACT

A circuit substrate for connection is used as a connecting member for electrically connecting a stator disposed inside a casing and a plurality of electric cables disposed outside the casing. A circuit substrate for connection is supported by a connecting member attachment. The connecting member attachment is molded using a circuit substrate for connection and a receptacle as inserts. Then, the circuit substrate for connection is disposed to pass through a wall portion of the casing in a thickness direction of the wall portion. The connecting member attachment is fixed onto the casing. Thus, the electric cables may be connected to the outside of the casing with a low-priced connecting structure.

7 Claims, 18 Drawing Sheets

(56) References Cited

FOREIGN PATENT DOCUMENTS

| | | |
|---|---|---|
| JP | 56-041746 | 4/1981 |
| JP | 2006-333664 | 12/2006 |
| WO | 01/29953 | 4/2001 |

* cited by examiner

CONNECTING STRUCTURE FOR ELECTRIC CABLES AND ELECTRIC APPARATUS

TECHNICAL FIELD

The present invention relates to a connecting structure for electric cables in an electric apparatus such as an electric motor.

BACKGROUND ART

Japanese Patent Application Publication No. 2006-333664 (JP2006-333664A) discloses a connecting structure for electric cables for electrically connecting an electric apparatus unit disposed in a casing for an electric apparatus such as a stepping motor to a plurality of electric cables disposed outside the casing. The electric apparatus unit includes a circuit substrate having a connection circuit pattern formed thereon. The cores of the electric cables are soldered to the circuit substrate of the electric apparatus unit. A portion where the circuit substrate of the electric apparatus unit and the electric cables are connected is molded of an electrically insulating resin.

According to conventional approaches, a connector is disposed on a wall portion of the casing to detachably connect the electric cables to the electric apparatus, and then the connector and the electric apparatus unit are electrically connected by some appropriate means.

The connecting structure for electric cables disclosed in JP 2006-333664A does not allow for electrical connection of the electric cables to the electric apparatus unit outside the casing, thereby complicating the connection of the electric cables and allowing no freedom to determine the length of the electric cables. A connecting structure for electric cables using a connector needs a dedicated connector, thereby increasing the overall costs.

SUMMARY OF THE INVENTION

An object of the present invention is to provide a low-priced connecting structure for electric cables, capable of connecting electric cables disposed outside a casing for an electric apparatus to the electric apparatus unit disposed inside the casing, and an electric apparatus using such connecting structure for electric cables.

Another object of the present invention is to provide a connecting structure for electric cables capable of utilizing existing parts and an electric apparatus using such connecting structure for electric cables.

A connecting structure for electric cables, of which improvements are aimed at by the present invention, is configured to electrically connect an electric apparatus unit disposed in a casing and electric cables disposed outside the casing. In one or more embodiments of the present invention, a connecting member used to electrically connect the electric apparatus unit and the electric cables may be disposed to pass through a wall portion of the casing in a thickness direction of the wall portion and not to move with respect of the casing.

In this configuration, a portion of the connecting member disposed outside the casing may be utilized for connection of the electric cables. Especially according to the present invention, the electric apparatus unit and the electric cables are electrically connected using the connecting member which does not move with respect to the casing, thereby attaining secure connection between the electric apparatus and the electric cables.

The connecting member may comprise a circuit substrate having a connection circuit pattern formed thereon for electrically connecting the electric apparatus unit and the electric cables. In this configuration, the connecting structure for electric cables may preferably further comprise a connecting member attachment configured to be attached to the wall portion of the casing with the circuit substrate of the connecting structure supported thereby. With this configuration, the circuit substrate of the connecting structure may be disposed not to move with respect to the casing simply by attaching the connecting member attachment to the wall portion of the casing.

As a typical connecting structure for electric cables, the cores of the electric cables may be connected directly to the connection circuit pattern of the circuit substrate of the connecting structure exposed outside the casing. In this connecting structure, the number of parts used in the connecting structure for electric cables may be reduced.

For example, the connecting member attachment may preferably be molded of an electrically insulating resin using the circuit substrate as an insert. This configuration may securely unify the connecting member attachment and the circuit substrate of the connecting structure.

A receptacle provided with a connection electrode may be used for connecting the electric cables. In this case, the connecting member attachment may be molded using the receptacle and the circuit substrate of the connecting structure as inserts. An existing receptacle may readily be fixed to the casing by insert molding, thereby eliminating the manufacture of a dedicated receptacle and configuring the connecting structure for electric cables at low costs.

An electric apparatus unit may include a circuit substrate having a connection circuit pattern formed thereon. The circuit substrate of the electric apparatus unit is partially opposed to the circuit substrate of the connecting structure for electric cables. In this configuration, the connection circuit pattern of the circuit substrate of the connecting structure and the connection circuit pattern of the circuit substrate of the electric apparatus unit are electrically connected via an electrically connecting component. The use of the electrically connecting component for connection between the connection circuit patterns of the circuit substrates of the electrical apparatus unit and the connecting structure may facilitate and secure the electrical connection between the electric apparatus unit and the electric cables.

A plurality of electrically conductive pin members may be used as the electrically connecting component, the electrically conductive pin members each extending in a direction orthogonal with the circuit substrate of the electric apparatus unit and electrically connected to the connection circuit pattern of the circuit substrate of the electric apparatus unit. When the electrically conductive pin members are used, the circuit substrate of the connecting structure may have a through hole formed therein for allowing the electrically conductive pin members to be inserted thereinto, and end portions of the electrically conductive pin members passing through the through hole may be soldered to the connection circuit pattern of the circuit substrate of the connecting structure. Thus, the connection circuit patterns of the circuit substrates of the electric apparatus unit and the connecting structure may readily be connected electrically to each other simply by inserting the electrically conductive pin members into the through hole of the circuit substrate of the connecting structure and then soldering the end portions of the pin members to the connection circuit pattern of the circuit substrate of the connecting structure. Thus, assembling of the electric apparatus may be facilitated.

The connecting member may comprise a plurality of electrically conductive terminal members. In this configuration, the connecting member attachment may preferably be attached to the wall portion of the casing with the electrically conductive terminal members supported thereby. Thus, the circuit substrate of the connecting structure may be disposed not to move with respect to the casing simply by attaching the connecting member attachment to the wall portion of the casing.

In this configuration, the connecting member attachment is formed with a plurality of support fitting holes for supporting the plurality of electrically conductive terminal members fitted therewith. Thus, the electrically conductive terminal members may be supported simply by fitting the electrically conductive terminal members in the support fitting holes of the connecting member attachment. Preferably, for example, the electrically conductive terminal members may each include a first connecting portion, an intermediate portion, and a second connecting portion. In this configuration, the cores of the electric cables are connected to the first connecting portion. The intermediate portion is continuous with the first connecting portion and extends in a direction crossing the first connecting portion. The second connecting portion is continuous with the intermediate connecting portion, extends in a direction crossing the intermediate portion, and is electrically connected to the electric apparatus unit. Further, the connecting member attachment may preferably be formed of an electrically insulating material, and the support fitting holes of the connecting member attachment may be each constituted from a groove portion in which a base portion of the first connecting portion and the intermediate portion are fitted, and a through hole portion having one end opening in the groove portion and the other end through which the second connecting portion extends out. The use of such support fitting holes may secure the supporting of the electrically conductive terminal members.

When the electric apparatus unit includes a circuit substrate having a connection circuit pattern formed thereon and the circuit substrate is partially opposed to the second connecting portions of the electrically conductive terminal members, the connection circuit pattern of the circuit substrate of the electric apparatus unit and the second connecting portions of the electrically conductive terminal members may electrically be connected via electrically connecting components. The electrically connecting components may each include an electrically conductive pin member extending in a direction orthogonal with the circuit substrate of the electric apparatus unit and electrically connected to the connection circuit pattern of the circuit substrate of the electric apparatus unit. The second connecting portions of the electrically conductive pin members each have a through hole formed therein for allowing the electrically conductive pin member to be inserted thereinto, and end portions of the electrically conductive pin members passing through the through holes are soldered to the second connecting portions. The electrically conductive pin members and the connection circuit pattern of the circuit substrate of the electric apparatus unit may readily be connected electrically to each other simply by inserting the electrically conductive pin members into the through holes of the second connecting portions and then soldering the end portions of the electrically conductive pin members to the second connecting portions. Thus, assembling of the electric apparatus may be facilitated.

The connecting member may comprise a plurality of lead wire members. The lead wire members are low-priced and are readily transformable, thereby facilitating the connection with the electric apparatus unit. The lead wire attachment and the electric cables may be connected by using a known connecting means such as a connector. When the lead wire members are used as the connecting member, the lead wire members may be used jointly with a connecting member attachment configured to be attached to the wall portion of the casing with the lead wire members supported thereby. In this case, the connecting member attachment is formed with a plurality of support fitting holes for allowing the lead wire members to be pressed thereinto. Further, the connecting member attachment may preferably be configured to liquid tightly block a through hole which is formed in the wall portion of the casing for allowing the lead wire members with the connecting member attachment to pass there through. When such connecting member is used, lead wire members having an arbitrary length may be used. In addition, the connecting member attachment may work to liquid tightly block the through hole through which the lead wire members pass. Likewise, the connecting member attachment may work to prevent an electrically insulating resin from leaking out of the through hole when a molded portion is formed inside the casing by filling the electrically insulating resin into the inside of the casing. The connecting member attachment may connect with a cannon plug including a plurality of terminals which are electrically connect to the lead wire members. The use of such connecting member attachment may readily increase the waterproof performance and electrical insulation of the connecting structure for electric cables.

When a molded portion is formed of an electrically insulating resin inside the casing, a portion of the circuit substrate of the connecting structure, which is located inside the casing, may preferably be disposed in the molded portion. This arrangement may securely fix the circuit substrate of the connecting structure, the electrically connecting component, and the circuit substrate of the electric apparatus unit in positions. In other words, the circuit substrate of the connecting structure, the electrically connecting component, and the circuit substrate of the electric apparatus unit may securely be maintained in a fixed positional relationship.

An electric apparatus provided with any one of the connecting structures for electric cables as described above for use with power supply cables may appropriately employ a desired connecting structure for electric cables when mass produced.

DETAILED DESCRIPTION OF PREFERRED EMBODIMENTS

Figure 1:
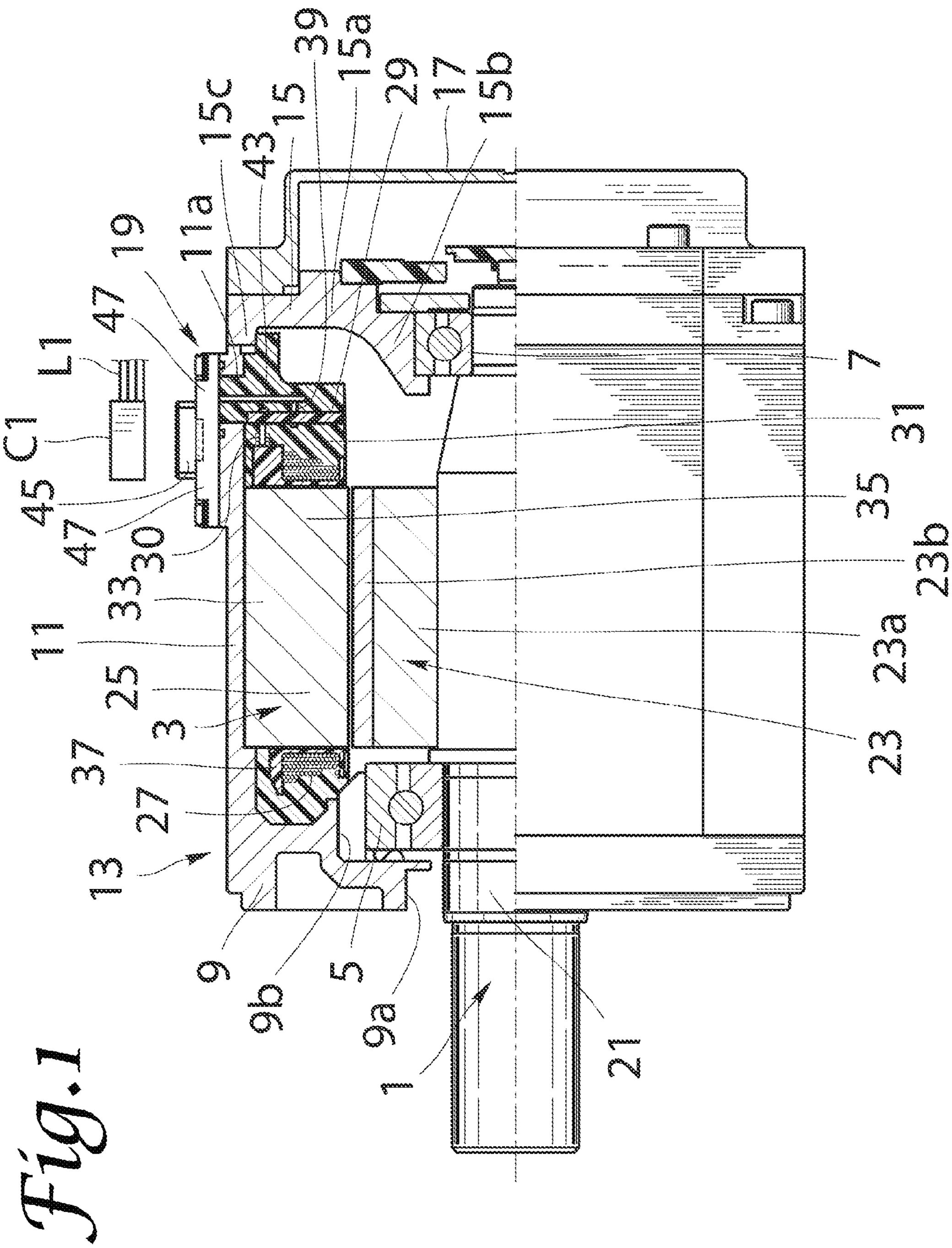
FIG. 1 is a partially cut-away front view of an electric apparatus provided with a connecting structure for electric cables according to an embodiment of the present invention as applied to an electric motor.
Figure 2:
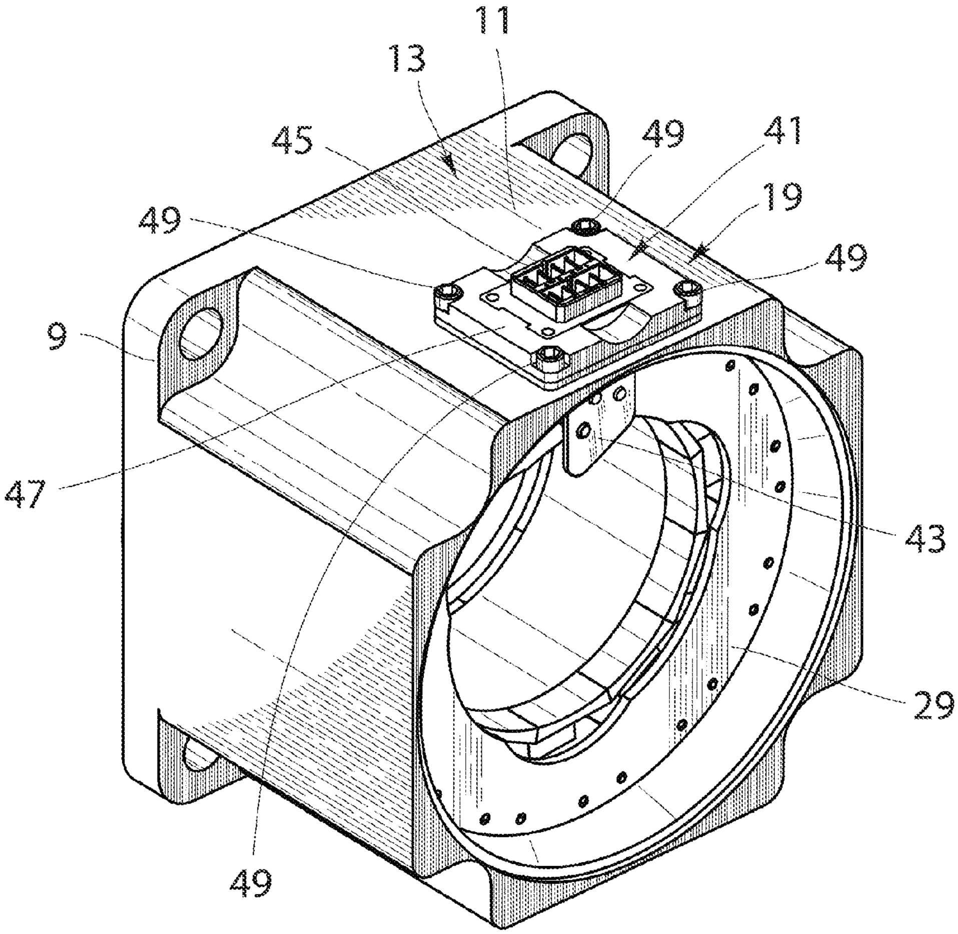
FIG. 2 is a perspective view of the electric apparatus of FIG. 1 wherein a rotor, a pair of ball bearings, a non-load-side end bracket, a cover member, and a molded portion are omitted from the illustration.

Now, embodiments of the present invention will be described below in detail with reference to the accompanying drawings. FIG. 1 is a partially cut-away front view of an electric apparatus, specifically, an electric motor provided with a connecting structure for electric cables according to an embodiment of the present invention. FIG. 2 is a perspective view of the electric motor, wherein a rotor 1 as described later, a pair of ball bearings 5, 7, a non-load-side end bracket 15, a cover member 17, and a molded portion 31 are omitted from the illustration. As illustrated in FIG. 1, the electric motor of the present embodiment may comprise the rotor 1, a stator 3, the pair of ball bearings 5, 7, a casing 13 integrally including a load-side end bracket 9 and a cylindrical portion 11, the non-load-side end bracket 15, the cover member 17, and a cable connecting unit 19. The rotor 1 includes a shaft 21 and a for magnetic pole 23 fixed on an outer peripheral surface of the shaft 21. The rotor magnetic pole 23 is constituted from a permanent magnet attachment portion 23*a* fixed on the outer peripheral surface of the shaft 21 and a plurality of permanent magnets 23*b* fixed on an outer peripheral portion of the permanent magnet attachment portion 23*a*.

The stator 3 includes a stator core 25, a plurality of winding portions 27, a circuit substrate 29 for connection, and the molded portion 31. The stator core 25 is formed of stacked magnetic steel plates. The stator core 25 is disposed radially outwardly of the shaft 21 and includes a cylindrical yoke 33 and a plurality of magnetic pole portions 35 projecting from the yoke 33 toward the shaft 21 to be opposed to the rotor magnetic pole 23. The winding portions 27 are provided on the stator core 25. Specifically, the winding portions 27 are wound around the magnetic pole portions 35 via an insulator 37 made of an electrically insulating material.

The circuit substrate 29 for connection has a connection circuit pattern formed on an electrically insulated substrate thereof. The circuit substrate 29 is annularly shaped, and is disposed to be opposed to a portion of the insulator 37 that covers an end surface of the stator core 25 as seen in an axial direction. The connection circuit pattern of the circuit substrate 29 is electrically connected to the winding portions 27 via a connecting conductor 30. A drive circuit for flowing excitation current through the winding portions 27 is provided on the circuit substrate 29. Electrically conductive pin members 39 are mounted on the circuit substrate 29, extending in a direction orthogonal with the circuit substrate 29 and electrically connected to the connection circuit pattern of the circuit substrate 29. The pin members 39 form an electrically connecting component. In the present embodiment, the rotor 1 and the stator 3 constitute a motor unit or an electric apparatus unit disposed inside the casing 3.

The molded portion 31 is formed of a thermosetting and electrically insulating resin. The molded portion 31 is formed inside the casing 13 and covers a part of the stator core 25, the winding portions 27, and a part of the cable connecting unit 19.

The load-side end bracket 9 is disposed on one axial side of the shaft 21. A load is connected to an end portion of the shaft 21 projecting out from the load-side end bracket 9 in the axial direction. The non-load-side end bracket 15 made of metal is disposed on the other axial side of the shaft 21.

The cylindrical portion 11, the load-side end bracket 9, and the non-load-side end bracket 15 are formed by aluminum die casting to constitute the casing 13. The load-side end bracket 9 of the casing 13 has a through hole 9*a* formed in a central portion of the end bracket 9 for allowing the shaft 21 to pass therethrough. An annular concave portion 9*b* is formed around the through hole 9*a* to open toward the non-load-side end bracket 15. One ball bearing 5 of the paired ball bearings 5, 7 is fitted in the annular concave portion 9*b*. A portion of the shaft 21 located in one axial side is rotatably supported onto the load-side end bracket 9 via the ball bearing 5.

The stator core 25 is fixed on an inner peripheral portion of the cylindrical portion 11 of the casing 13 which is unitarily formed with the load-side end bracket 9. The cylindrical portion 11 of the casing 13 has a through hole 11*a* formed in a wall portion thereof to pass the wall portion in a thickness direction of the wall portion. The through hole 11*a* is intended to allow a circuit substrate 43 for connection, which will be described later, to be inserted into the casing 13.

The non-load-side end bracket 15 is in contact with the other end portion of the stator 3 or the other end portion of the molded portion 31. The non-load-side end bracket includes a bracket body 15*a* extending in a radial direction, an annular inner rib 15*b* unitarily formed with the bracket body and projecting therefrom in the axial direction, and an annular outer rib 15*c* unitarily formed with the bracket body 15*a* and located more outward than the inner rib 15*b* in the radial direction. The bracket body is shaped in a rectangular flange. An inner surface of the inner rib 15*b* is fitted with the other ball bearing of the paired ball bearings 5, 7. Thus, a portion of the shaft 21 located on the other axial side is rotatably supported onto the non-load-side end bracket 15 via the other ball bearing 7

The cover member 17 is attached to the non-load-side end bracket 15 and covers the other end portion of the shaft 21 as seen in the axial direction.

Figure 3:
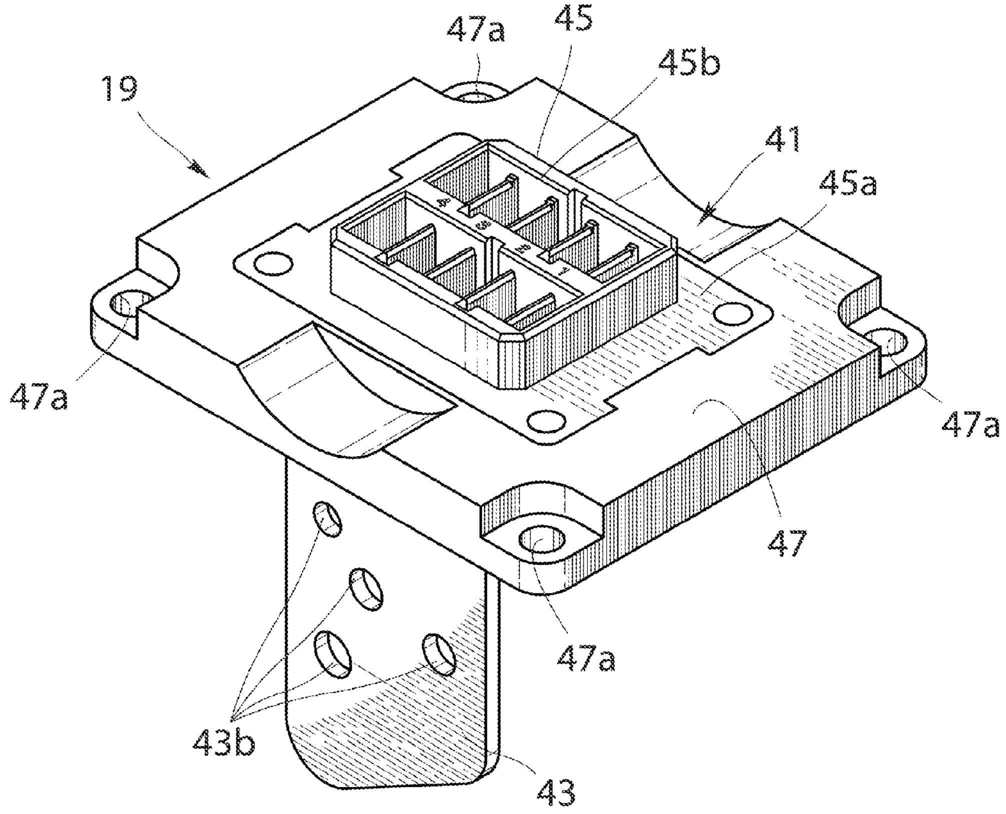
FIG. 3 is a perspective view of a cable connecting unit used in the electric apparatus of FIG. 1.
Figure 4:
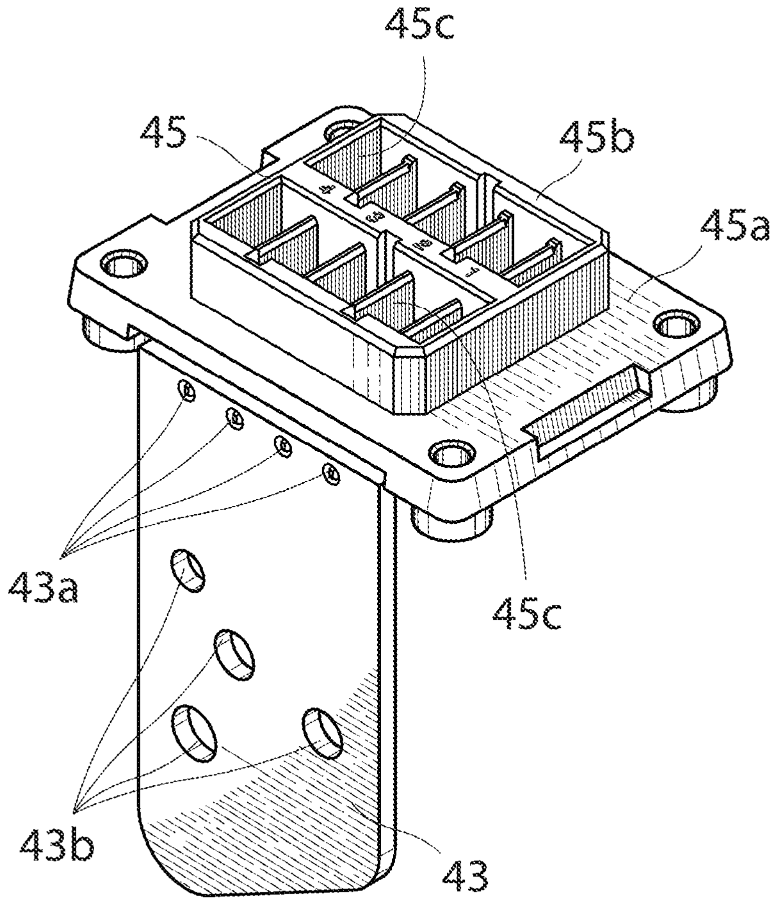
FIG. 4 is a perspective view of the cable connecting unit of FIG. 3 wherein a resin molded portion is omitted from the illustration.

The cable connecting unit 19 includes a connecting member attachment 41 and the circuit substrate 43 for connection supported by the connecting member attachment 41, as illustrated in the perspective view of FIG. 3. The connecting member attachment 43 is molded using the circuit substrate 43 and a receptacle 45 as inserts. A resin molded portion 47 is formed around the receptacle 45. The receptacle 45 is a female connector capable of detachably connecting with a connection terminal member C1 connected to a plurality of electric cables L1 disposed outside the casing 13, as illustrated in FIG. 1. In the present embodiment, a commercially available receptacle is used as the receptacle 45. The connecting member attachment 41 thus formed by insert molding allows a commercially available receptacle of any shape and size to be fixed with respect to the casing 13. As illustrated in FIG. 4, the receptacle 45 includes a base 45*a* and a connector portion 45*b*. The connector portion 45*b* has a plurality of concave portions 45*c* formed therein for fitting with the connection terminal member C1. FIG. 4 is a perspective view of the cable connecting unit 19 of FIG. 3 wherein the resin molded portion 47 is omitted from the illustration.

The circuit substrate 43 for connection has a connection circuit pattern formed thereon. Specifically, the connection circuit pattern is formed by printing and copper foiling on the circuit substrate 43 having hardness or rigidity. The circuit substrate 43 is shaped substantially in a rectangle. As illustrated in FIG. 4, four through hole electrically conductive portions 43*a* are formed in the circuit substrate 4 along one side of the circuit substrate 43 for the purpose of soldering. The four through hole electrically conductive portions 43*a* are connected to four electrodes for soldering, not illustrated but provided on the back surface of the base 45*a* of the receptacle 45 for the purpose of connection. The four soldered electrodes are electrically connected to female connector electrodes provided in the receptacle 45. The connection circuit pattern, not illustrated, is formed on one of the surfaces of the circuit substrate 43, and is connected to the four through hole electrically conductive portions 43*a* for performing soldering. The circuit substrate 43 for connection is fixed with respect to the base 45*a* of the receptacle 45 so as to extend in a direction orthogonal with an extending direction of the base 45*a*. The connection circuit pattern of the circuit substrate 43 is electrically connected to a plurality of through hole electrically conductive portions provided in the concave portions 45*c* of the receptacle 45.

As illustrated in FIG. 1, the circuit substrate 43 for connection is disposed such that a portion of the circuit substrate 43, which passes through the through hole formed through the wall portion of the cylindrical portion 11 of the casing 13 in the thickness direction and is then located inside the casing, is disposed in the molded portion 31. Then, the circuit substrate 43 is disposed to be opposed to the circuit substrate 29 and not to move with respect to the casing 13. In other words, the circuit substrate is partially opposed to the circuit substrate 43. As illustrated in FIG. 4, the circuit substrate 43 has four through holes 43*b* formed therein. As illustrated in FIG. 1, the electrically conductive pin members 39 attached to the circuit substrate 29 are inserted into the four through holes 43*b*. FIG. 1 is a half cross sectional view showing one electrically conductive pin members 39 inserted in one of the through holes 43*b*. An end portion of each electrically conductive pin member passing through the through hole 43*b* is soldered to the connection circuit pattern of the circuit substrate 43. Thus, the connection circuit pattern of the circuit substrate 43 and the connection circuit pattern of the circuit substrate 29 are electrically connected via the electrically conductive pin members 39.

As illustrated in FIG. 3, the resin molded portion 47 is formed to surround the base 45*a* of the receptacle 45 by insert molding using the receptacle 45 and the circuit substrate 43 as inserts. The resin molded portion 47 has a through hole 47*a* formed at each of four corners. As illustrated in FIG. 2, the connecting member attachment 41 is attached to the wall portion of the cylindrical portion 11 of the casing 13 with the circuit substrate 43 supported thereby. Specifically, the connecting member attachment 41 is attached to the wall portion with four screws 49 which are screwed into screw holes formed in the cylindrical portion 11 of the casing 13 after passing through the four through holes 47*a*.

In the present embodiment, the circuit substrate 43 is soldered to the base 43*a* of the receptacle 43 as illustrated in FIG. 4, and then the resin molded portion is molded using the circuit substrate 43 and the receptacle 45 as inserts to obtain the cable connecting unit 19 as illustrated in FIG. 3.

In the present embodiment, the cable connecting unit 19 is attached to the casing 13. First, the stator core 25 provided with the circuit substrate 29 for connection is fixed in the cylindrical portion 11 of the casing 13. Next, the circuit substrate 43 is inserted into the casing 13 through the through hole 11*a* of the casing 13 such that the electrically conductive pin members 39 are spaced away from the circuit substrate 43 of the cable connecting unit 19. Then, the circuit substrate 43 is moved in such direction that a surface of the circuit substrate 43, which faces the circuit substrate 29, is brought closer to the circuit substrate 29 and then the electrically conductive members 39 are inserted into the through holes 43*b* of the circuit substrate 43. An end portion of each electrically conductive pin member 39 is slightly projected from the back surface of the circuit substrate 43. The through hole 11*a* has an enough size to allow such movement of the circuit substrate 43. Next, as illustrated in FIG. 2, the connecting member attachment 41 is attached to the wall portion of the cylindrical portion 11 of the casing 13 with the four screws 49. Then, the end portions of the electrically conductive pin members 39 are soldered to the connection circuit pattern of the circuit substrate 43. Finally, the molded portion 31 is formed of an electrically insulating resin inside the casing 13. Thus, the attachment of the cable connecting unit 19 is completed.

The connecting structure for electric cables of the present embodiment allows connection of the electric cables L1 via the receptacle 45 by utilizing a portion of the circuit substrate 43 disposed outside the casing 13. The stator 3 of the electric apparatus unit is electrically connected to the electric cables L1 using the circuit substrate 43 for connection that does not move with respect to the casing 13, thereby securing the connection between the stator 3 and the electric cables L1.

Figure 5:
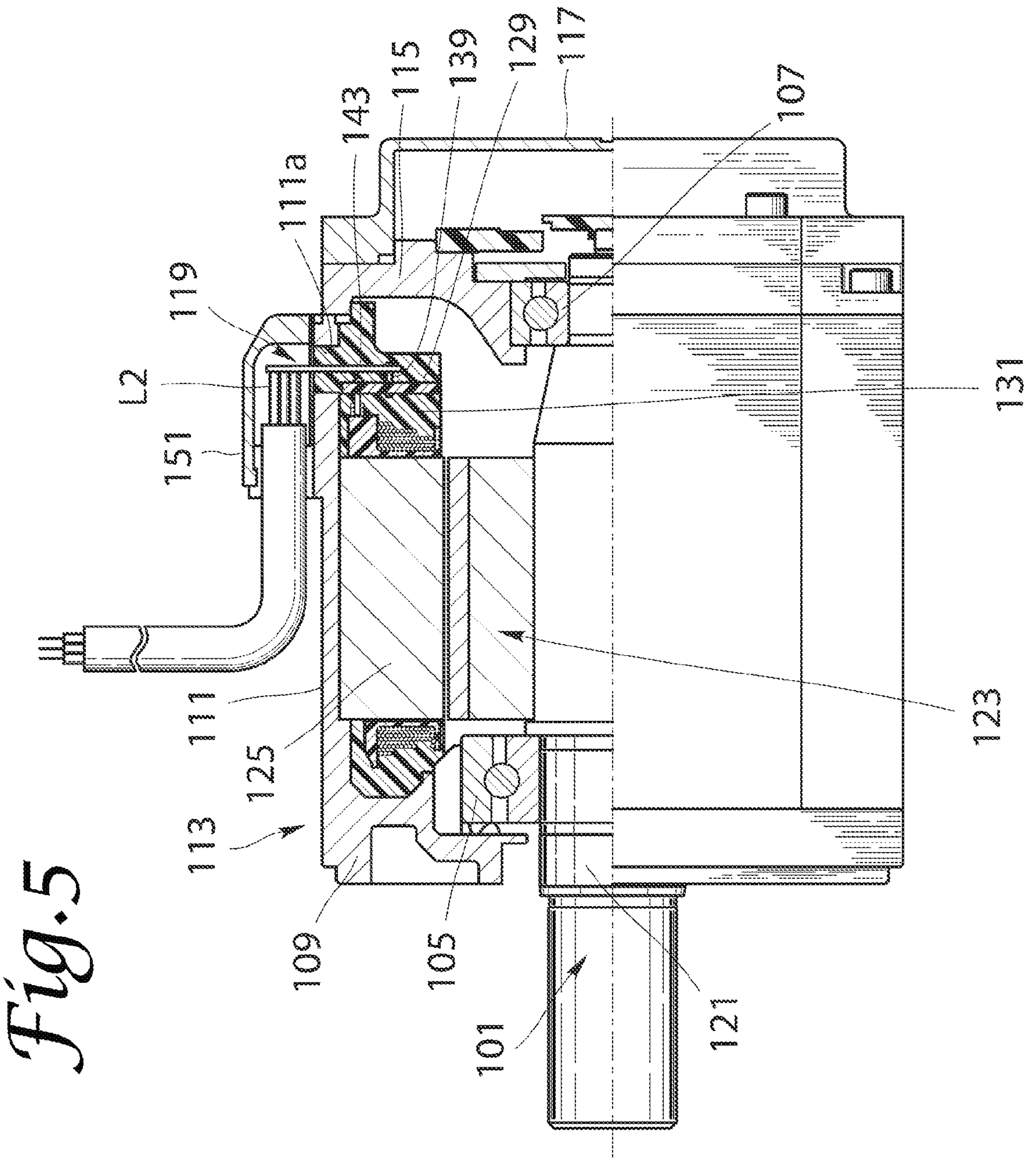
FIG. 5 is a partially cut-away front view of an electric apparatus provided with a cable connecting unit according to another embodiment of the present invention.
Figure 6:
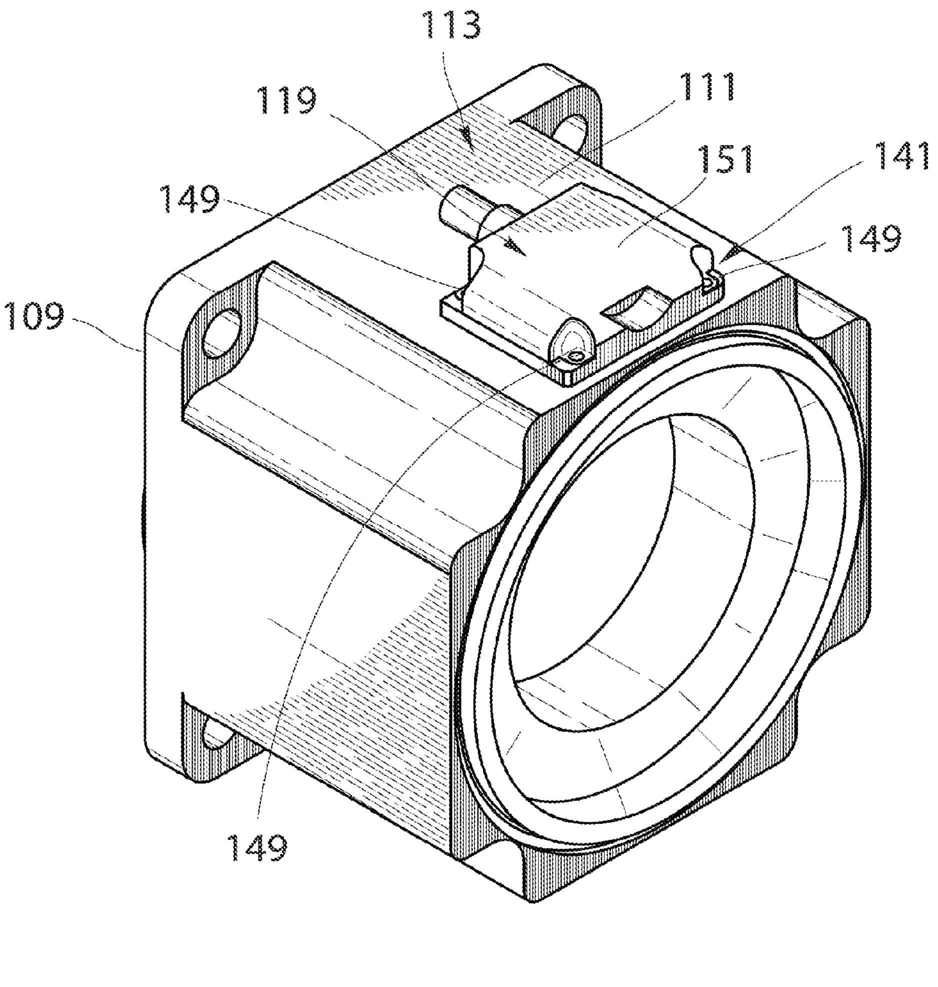
FIG. 6 is a perspective view of the electric apparatus of FIG. 5 wherein a rotor, a pair of ball bearings, a non-load-side end bracket, and a cover member are omitted from the illustration.
Figure 7:
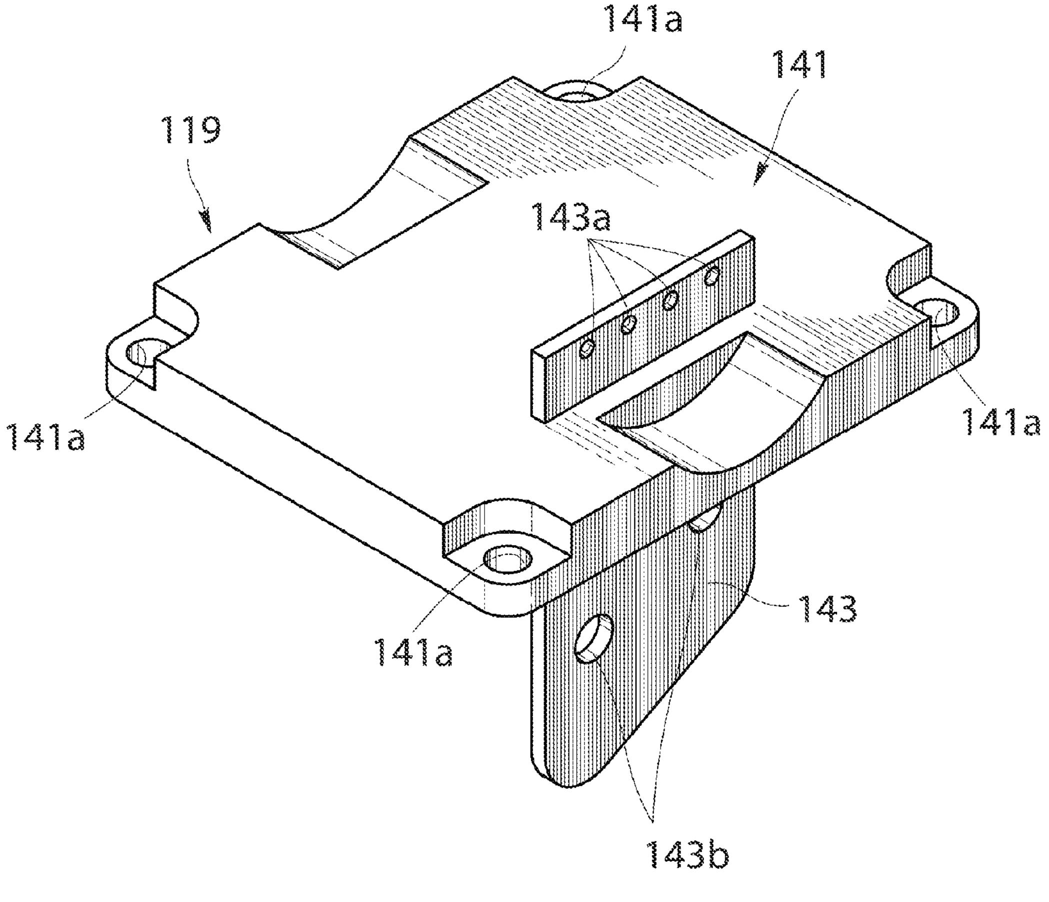
FIG. 7 is a perspective view of the cable connecting unit used in the electric apparatus of FIG. 5.

FIG. 5 is a partially cut-away front view of an electric apparatus, specifically, an electric motor provided with a connecting structure for electric cables according to another embodiment of the present invention. FIG. 6 is a perspective view of the electric motor wherein a rotor 101, a pair of ball bearings 105, 107, a non-load-side end bracket 115, and a cover member 117 are omitted from the illustration. FIG. 7 is a perspective view of a cable connecting unit 119 used in the electric motor of FIG. 5. The configuration of the electric motor illustrated in FIGS. 5 to 7 except for a cable connecting unit is the same as that of the electric motor illustrated in FIGS. 1 to 4. Out of the parts or members illustrated in FIGS. 5 to 7, those parts or members structurally similar to those illustrated in FIGS. 1 to 4 are allocated reference numerals or signs obtained by adding 100 to the reference numerals or signs shown in FIGS. 1 and 2, and accordingly the descriptions thereof are omitted.

As particularly illustrated in FIG. 7, the cable connecting unit 119 used in the present embodiment includes a connecting member attachment 141 and a circuit substrate 143 for connection supported by the connecting member attachment 141. The connecting member attachment 141 is molded of an electrically insulating resin using the circuit substrate 143 as an insert. The connecting member attachment 141 is provided with a cap 151 for covering the connecting member attachment 141. Refer to FIGS. 5 and 6. The connecting member attachment 141 has a through hole 141*a* at each of four corners. The positional relationship of the four through holes 141*a* with the circuit substrate 143 for connection is the same as that of the four through holes 47*a* formed in the resin molded portion 41 illustrated in FIG. 3 with the circuit substrate 43 for connection. As illustrated in FIG. 6, the connecting member attachment 141 is attached to a wall portion of a cylindrical portion 111 of a casing 113 together with the cap 151 with the circuit substrate 143 supported by the connecting member attachment 141. Specifically, the connecting member attachment 141 is attached to the wall portion with four screws 149 which are screwed into screw holes formed in the cylindrical portion 111 of the casing 113 after passing through the four through holes 141*a*.

The circuit substrate 143 has the same structure as that of the circuit substrate 43 illustrated in FIG. 4. End portions of electrically conductive pin members 139 passing through through holes 143*b* are soldered to the connection circuit pattern of the circuit substrate 143. In the present embodiment, as illustrated in FIG. 5, the cores of four electric cables L2 are directly connected to the connection circuit pattern of the circuit substrate 143 using four through hole electrically conductive portions 143*a* formed in the circuit substrate 143 exposed outside the casing 113.

The connecting structure for electric cables of the present embodiment allows direct connection of the cores of the electric cables L2 to the connection circuit pattern of the circuit substrate 143, thereby reducing the number of parts or components used in the connecting structure for electric cables.

Figure 8:
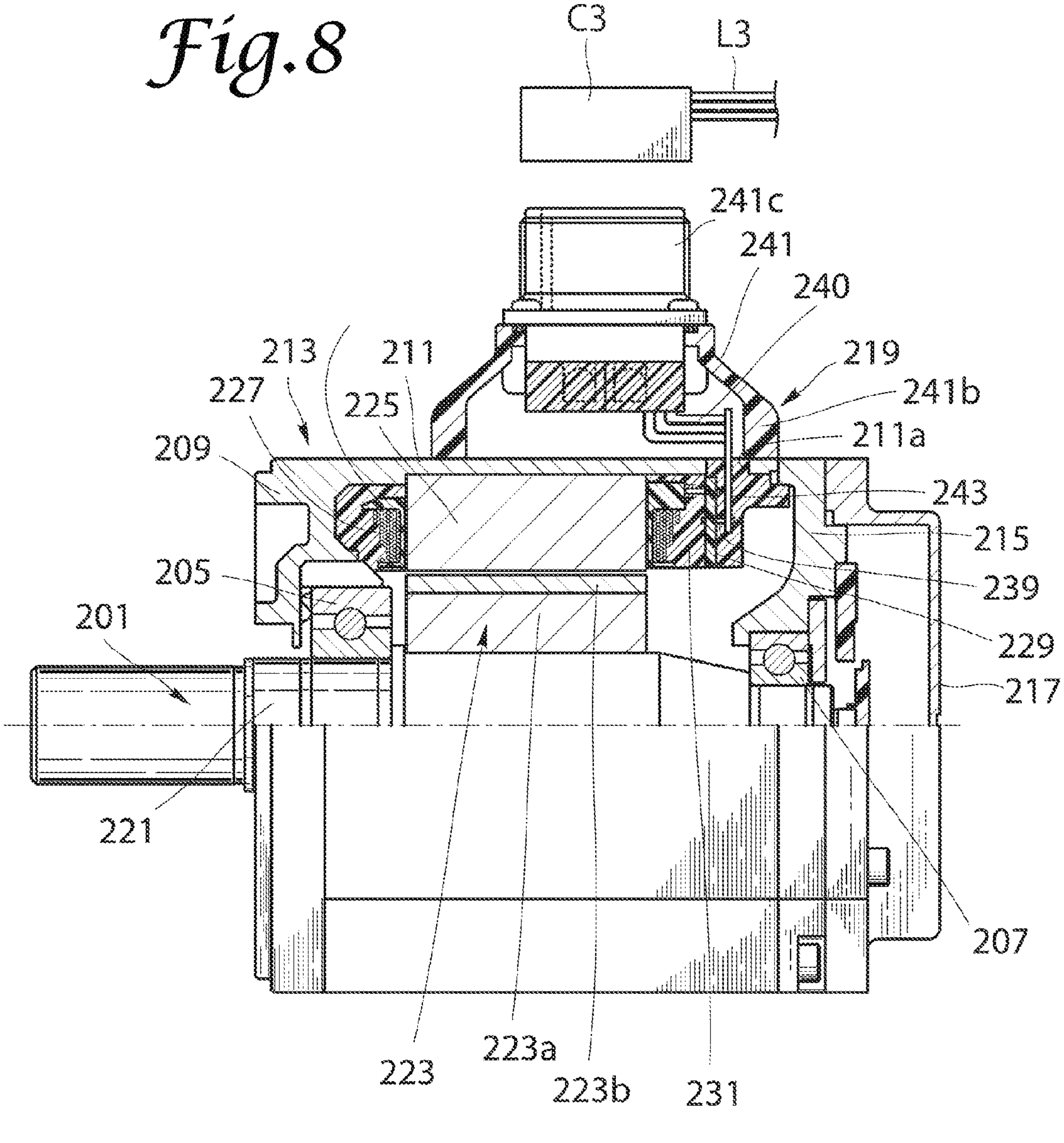
FIG. 8 is a partially cut-away front view of an electric apparatus provided with a cable connecting unit according to yet another embodiment of the present invention.
Figure 9:
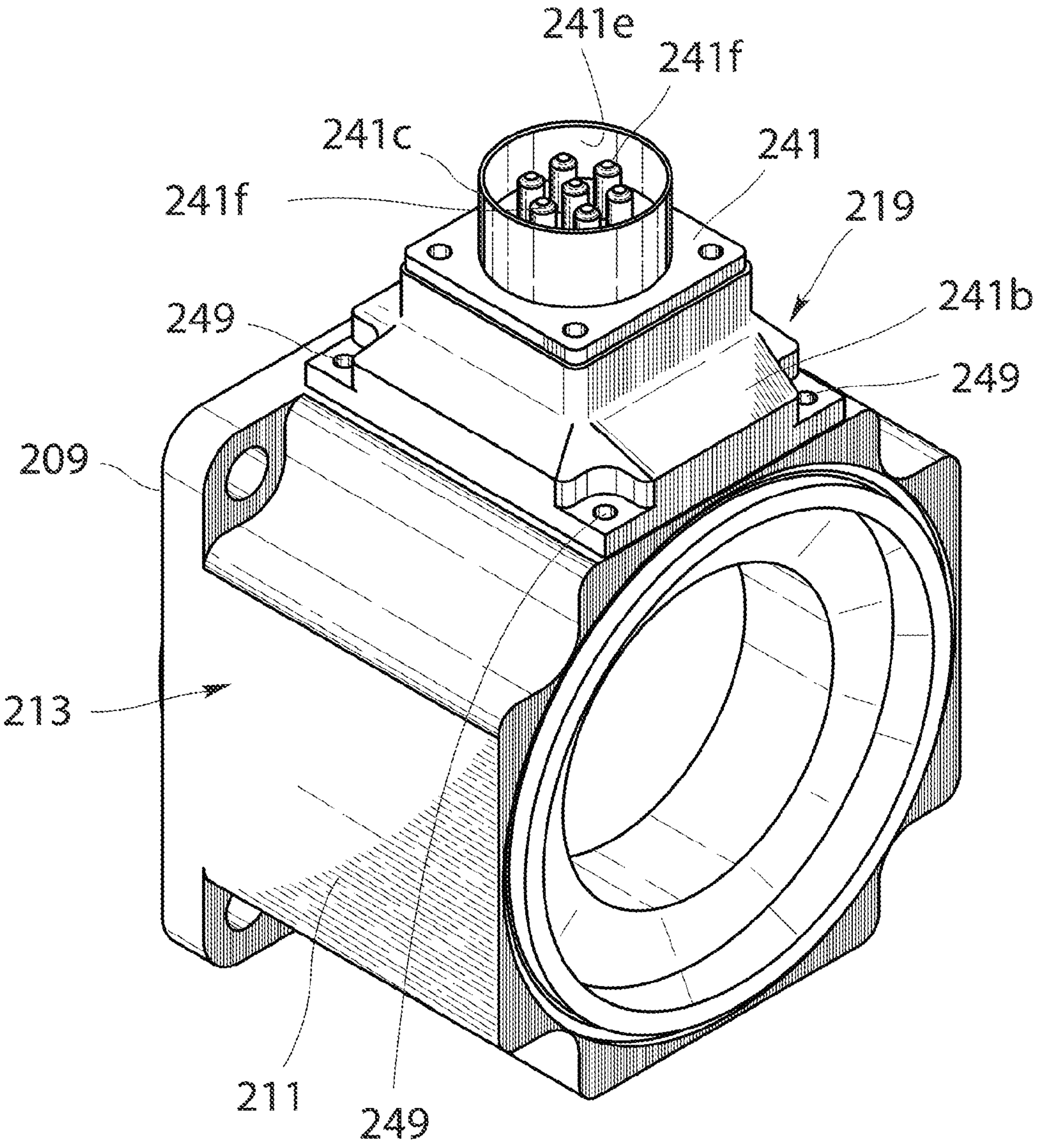
FIG. 9 is a perspective view of the electric apparatus of FIG. 8 wherein a rotor, a pair of ball bearings, a non-load-side end bracket, and a cover member are omitted from the illustration.

FIG. 8 is a partially cut-away front view of an electric apparatus, specifically, an electric motor provided with a connecting structure for electric cables according to yet another embodiment of the present invention. FIG. 9 is a perspective view of the electric motor wherein a rotor 201, a pair of ball bearings 205, 207, a non-load-side end bracket 215, and a cover member 217 are omitted from the illustration. FIG. 7 is a perspective view of a cable connecting unit 119 used in the electric motor of FIG. 5. The configuration of the electric motor illustrated in FIGS. 8 and 9 except for a cable connecting unit is the same as that of the electric motor illustrated in FIGS. 1 to 4. Out of the parts or members illustrated in FIGS. 8 and 9, those parts or members structurally similar to those illustrated in FIGS. 1 to 4 are allocated reference numerals or signs obtained by adding 200 to the reference numerals or signs shown in FIGS. 1 and 2, and accordingly the descriptions thereof are omitted.

As illustrated in FIG. 8, the cable connecting unit 219 used in the present embodiment includes a connecting member attachment 241 and a circuit substrate 243 for connection supported by the connecting member attachment 241. The connecting member attachment 241 includes connector or so-called cannon plug and lead wires 240. The connector or cannon plug is detachably connected to a terminal member C3 for connection connected with the electric cables L3 disposed outside the casing 213. The connecting member attachment 241 includes a cylindrical base portion 241*b* and a connector portion 241*c*. The base cylindrical portion 241*b* has a through hole formed at each of four corners. As illustrated in FIG. 9, the connecting member attachment 241 is attached to a wall portion of a cylindrical portion 211 of a casing 213 with the circuit substrate 243 supported thereby. Specifically, the connecting member attachment 241 is attached to the wall portion with four screws 249 which are screwed into screw holes formed in the cylindrical portion 211 of the casing 213 after passing through the through holes formed in the base 241*b*.

As illustrated in FIG. 9, the connector portion 241*c* has a concave portion 241*e* formed to open upward. Seven terminals 241*f* are formed in the concave portion 241*e* to be fitted with the terminal member C3 for connection as illustrated in FIG. 8.

The circuit substrate 243 has the same structure as that of the circuit substrate 43 illustrated in FIG. 4. End portions of electrically conductive pin members 239 passing through through holes 243*b* are soldered to the connection circuit pattern of the circuit substrate 243. In the present embodiment, as illustrated in FIG. 8, the cores of lead wires 240, which are electrically connected to four terminals actually used out of seven terminals 241*f*, are connected to the connection circuit pattern of the circuit substrate 243 via four through hole electrically conductive portions provided in the circuit substrate 243 disposed outside the casing 213. Thus, the connecting member attachment 241 of the present embodiment supports the circuit substrate 243 for connection by means of the lead wires 240.

Figure 10:
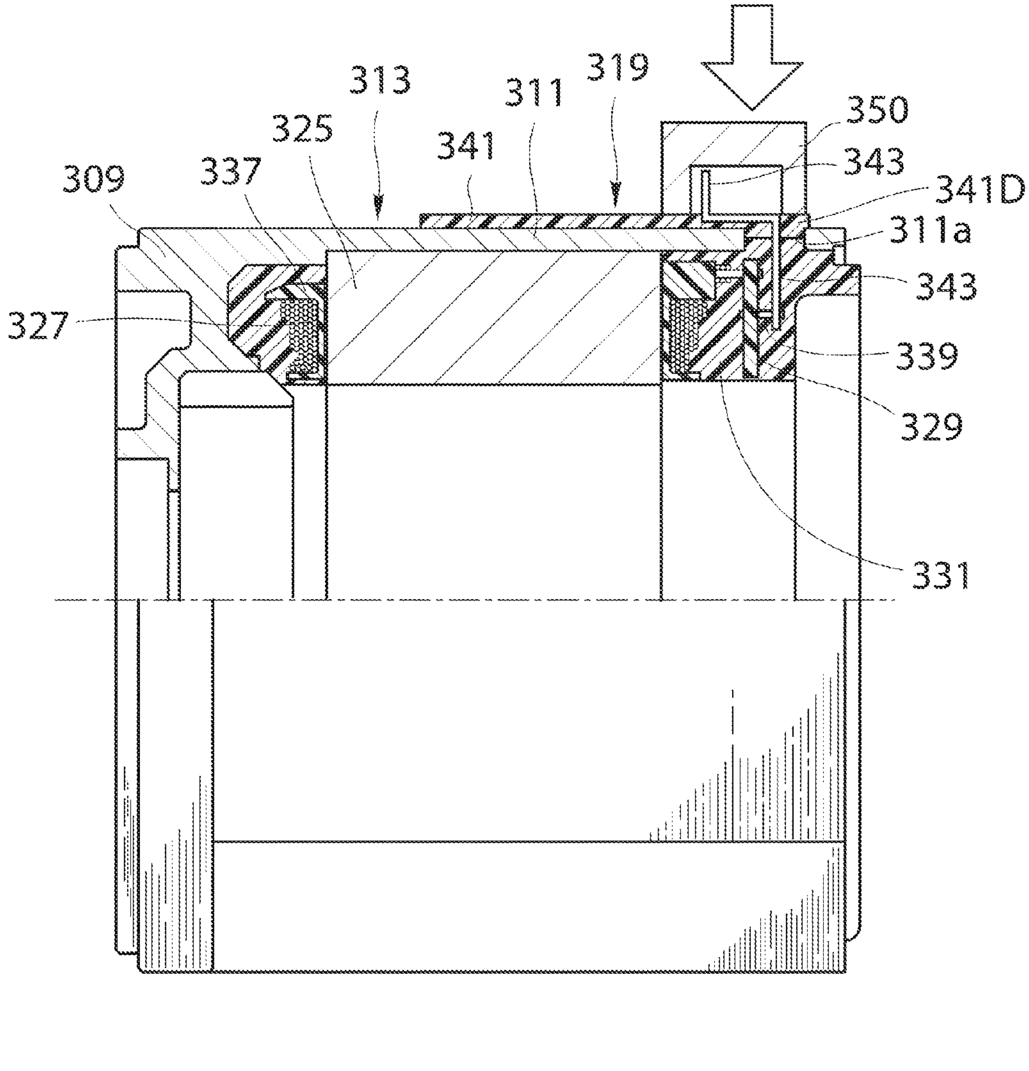
FIG. 10 is a partially cut-away front view of a stator for an electric motor provided with another connecting structure for electric cables according to still another embodiment of the present invention.
Figure 11:
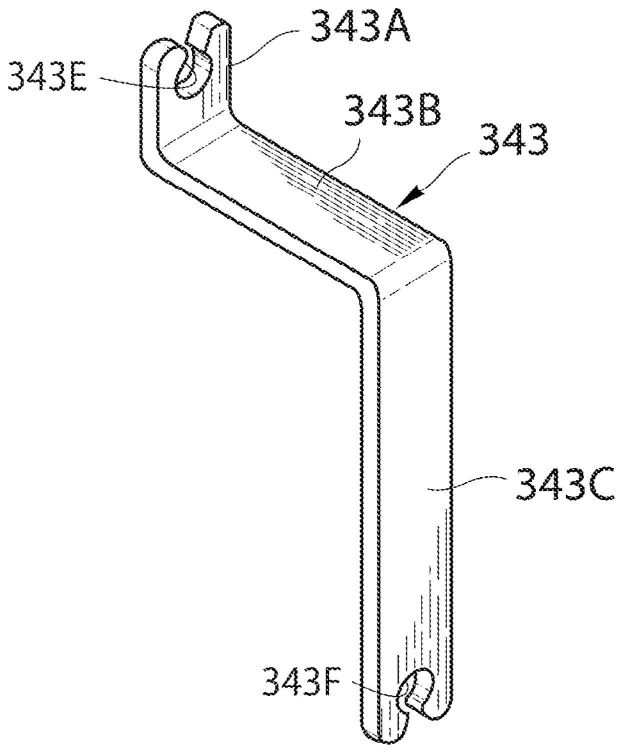
FIG. 11 is a perspective view of one electrically conductive terminal member used as a connecting member in the embodiment of FIG. 10.
Figure 12A:
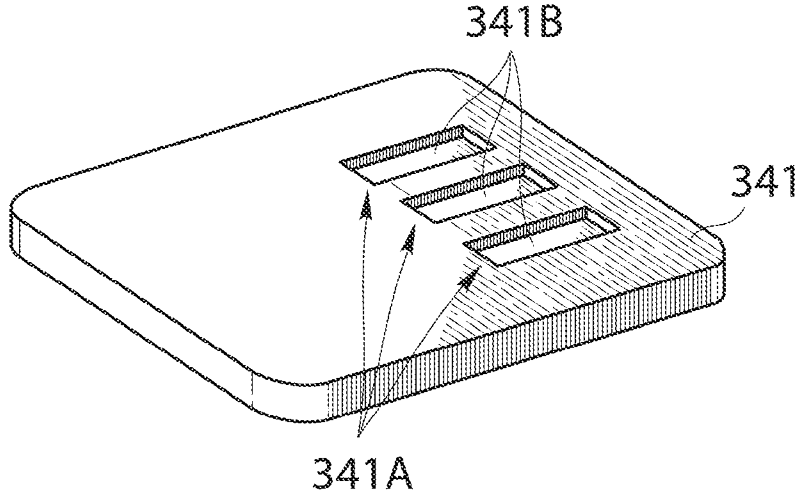
FIGS. 12A and 12B are perspective views of a connecting member attachment that supports three electrically conductive terminal members as viewed in different directions.
Figure 12B:
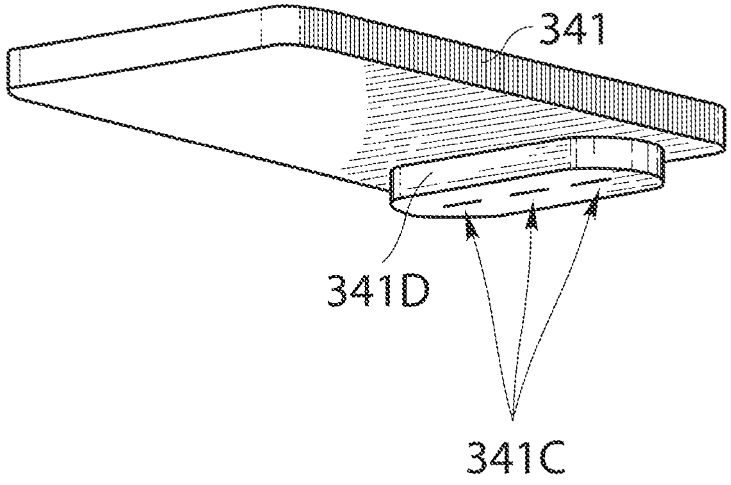
Figure 13A:
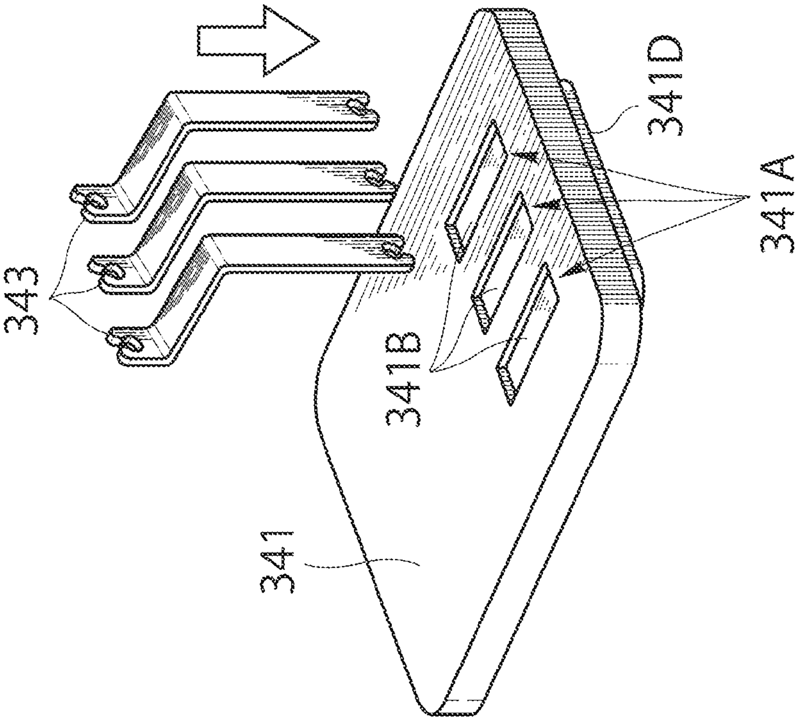
FIGS. 13A and 13B are perspective views illustrating respectively the connecting member attachment before and after the attachment of three electrically conductive terminal members.
Figure 13B:
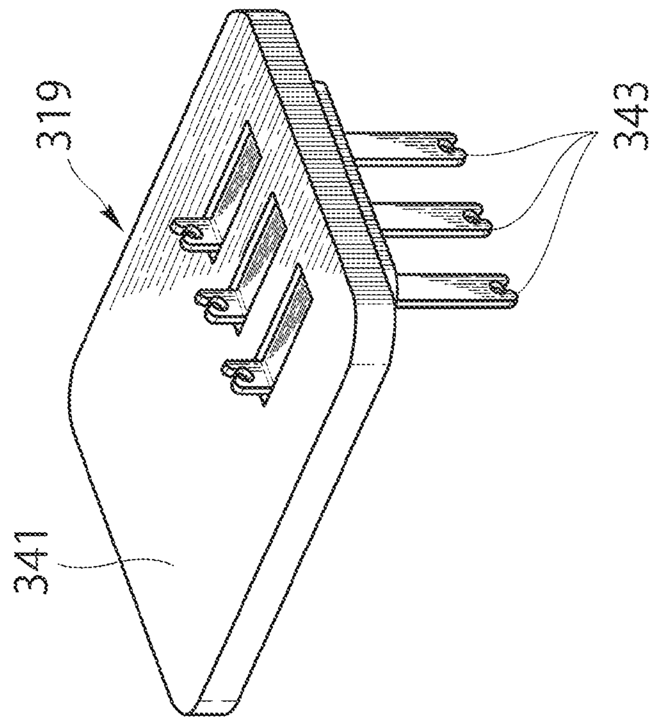

FIG. 10 is a partially cut-away front view of a stator for an electric apparatus, specifically, an electric motor provided with another connecting structure for electric cables according to still another embodiment of the present invention. FIG. 11 is a perspective view of one electrically conductive terminal member 343 used as a connecting member in the present embodiment. FIGS. 12A and 12B are perspective views of a connecting member attachment 341 that supports three electrically conductive terminal members 343 as viewed in different directions. FIGS. 13A and 13B are perspective views illustrating respectively the connecting member attachment 341 before and after the attachment of the three electrically conductive terminal members 343. The configuration of the stator for an electric motor illustrated in FIG. 10 except for a cable connecting unit is the same as that of the electric motor illustrated in FIGS. 1 to 4. Out of the parts or members illustrated in FIG. 10, those parts or members structurally similar to those illustrated in FIGS. 1 to 4 are allocated reference numerals or signs obtained by adding 300 to the reference numerals or signs shown in FIGS. 1 and 2, and accordingly the descriptions thereof are omitted.

As illustrated in FIGS. 10 and 13, the cable connecting unit 319 includes a connecting member attachment 341 and three electrically conductive terminal members 343 supported by the connecting member attachment 341. As illustrated in FIG. 11, the electrically conductive terminal members 343 each include a first connecting portion 343A, an intermediate portion 343B, and a second connecting portion 343C. In this configuration, the core of each electric cable is connected to the first connecting portion 343A. The intermediate portion 343B is continuous with the first connecting portion 343A and extends in a direction crossing the first connecting portion 343A. The second connecting portion 343C is continuous with the intermediate connecting portion 343B, extends in a direction crossing the intermediate portion 343B, and is electrically connected to an electrically conductive pin member 339 leading to a drive circuit disposed in the stator. A recess or slit portion 343E is formed in the first connecting portion 343A. The cores of the electric cables are fitted in recess or slit portion 343E and soldered thereto. Likewise, a recess or slit portion 343F formed with a through hole is provided in the second connecting portion 343C. The electrically conductive pin members 339 are fitted in the through holes of the recess or slit portions 343F and soldered thereto.

As illustrated in FIG. 12, the connecting member attachment 341 has three support fitting holes 341A formed for supporting three electrically conductive terminal members 343 with the three electrically conductive terminal members fitted with the support fitting holes 341A. The connecting member attachment 341 is formed of an electrically insulating material such as fluororubber. The support fitting holes 341A each include a groove portion 341B in which a base portion of the first connecting portion 343A and the intermediate portion 343B of the electrically conductive terminal member 343 are fitted and a through hole portion 341C having one end opening in the groove portion 341B and allowing the second connecting portion 343C to extend out therethrough. The connecting member attachment 341 unitarily include a projecting portion 341D through which the through hole portions 341C pass. The projecting portion 341D is fitted in the through hole 311*a* formed in the cylindrical portion 311 of the casing 313. When forming a molded portion 331, as illustrated in FIG. 10, the stator is placed inside a mold with the connecting member attachment 341 being pressed onto the cylindrical portion 311 of the casing 313 with a metallic pressing tool 311*a*, and then the stator is molded by filling a resin into the stator. The use of the connecting member attachment thus obtained allows the supporting of a plurality of electrically conductive terminal members 343 simply by fitting the electrically conductive terminal members 343 in the support fitting holes 341A.

When the stator of the present embodiment includes a circuit substrate 329 for connection having a connection circuit pattern and partially opposed to the second connecting portions 343C of the three electrically conductive terminal members 343 as illustrated in FIG. 10, the connection circuit patter of the circuit substrate 329 and the second connecting portions 343C of the three electrically conductive terminal members 343 are electrically connected to each other via electrically conductive connecting components, specifically, electrically conductive pin members 339. Thus, the electrically conductive terminal members 343 and the connection circuit pattern of the circuit substrate 329 may electrically be connected simply by inserting the electrically conductive pin members 339 into through holes formed in the recess or slit portion 343F of the second connection portion 343, and then soldering end portions of the electrically conductive pin members 339 to the second connecting portion 343C. Alternatively, the cores of the electric cable may directly be soldered to the first connecting portions 343A of the electrically conductive terminal members 343 in a state shown in FIG. 10.

Figure 14:
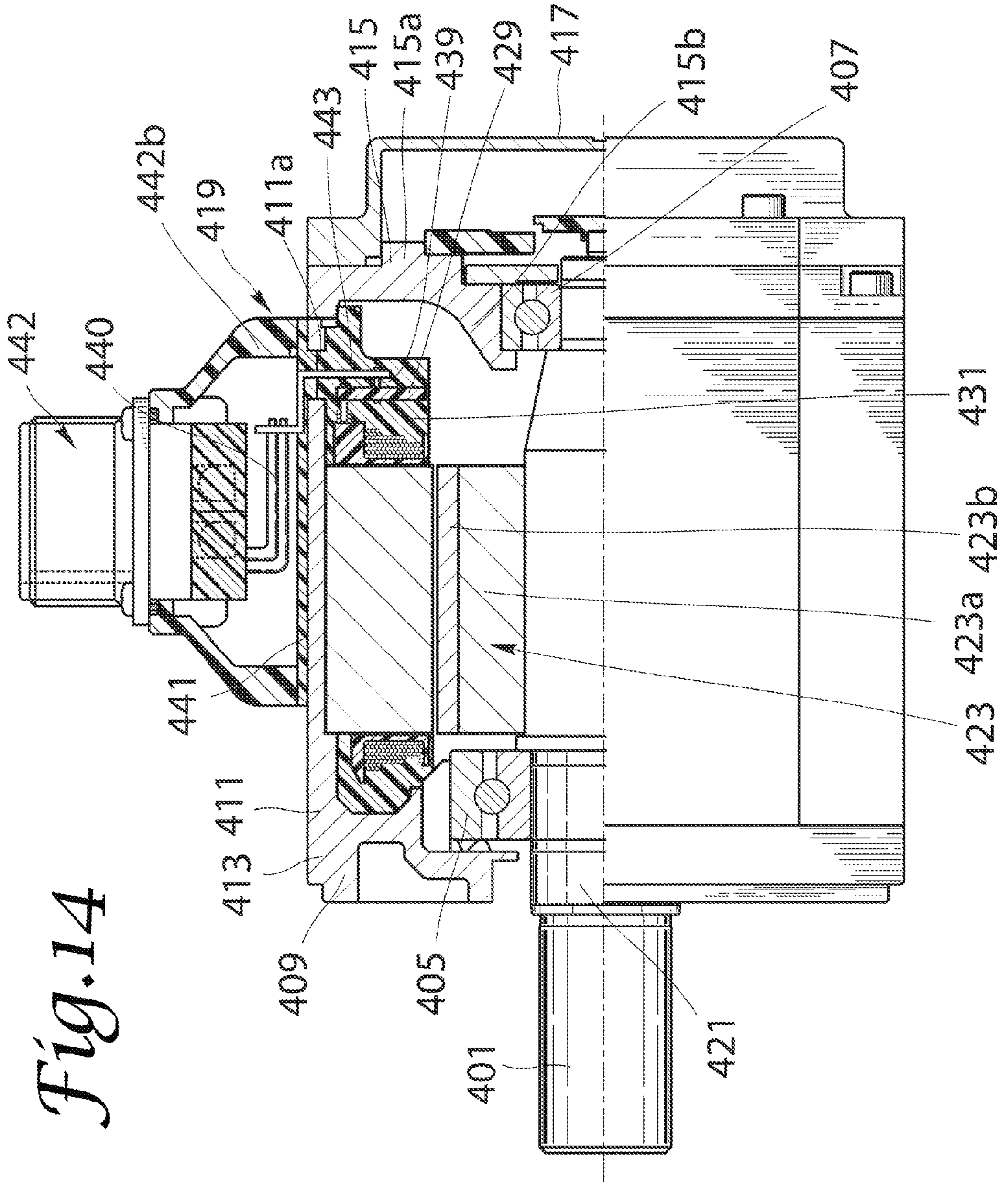
FIG. 14 is a half cross sectional view of a cable connecting unit provided with a cannon plug for facilitating and securing the connection of cables according to a further embodiment of the present invention.

FIG. 14 is a half cross sectional view of a cable connecting unit 419 provided with a cannon plug 442 for facilitating and securing the connection of electric cables according to a further embodiment of the present invention. In FIG. 14, those parts or members structurally similar to those illustrated in FIGS. 1 to 4 are allocated reference numerals or signs obtained by adding 400 to the reference numerals or signs shown in FIGS. 1 and 2, and accordingly the descriptions thereof are omitted. The stator of the present embodiment is provided with the cable connecting unit which has substantially the same structure as the cable connecting unit 319 of the embodiment shown in FIG. 10 except that the cannon plug is fixed to the cable connecting unit 319 in the present embodiment. A plurality of terminals, not illustrated, provided in the cannon plug 442 are connected to a plurality of electrically conductive terminal members 443 by soldering or swaging the cores of lead wires 440 to the electrically conductive terminal members 443. Then, a cylindrical base 442*b* of the cannon plug 442 is attached on a connecting member attachment 441 by some means such as ultrasonic adhesion.

Figure 15:
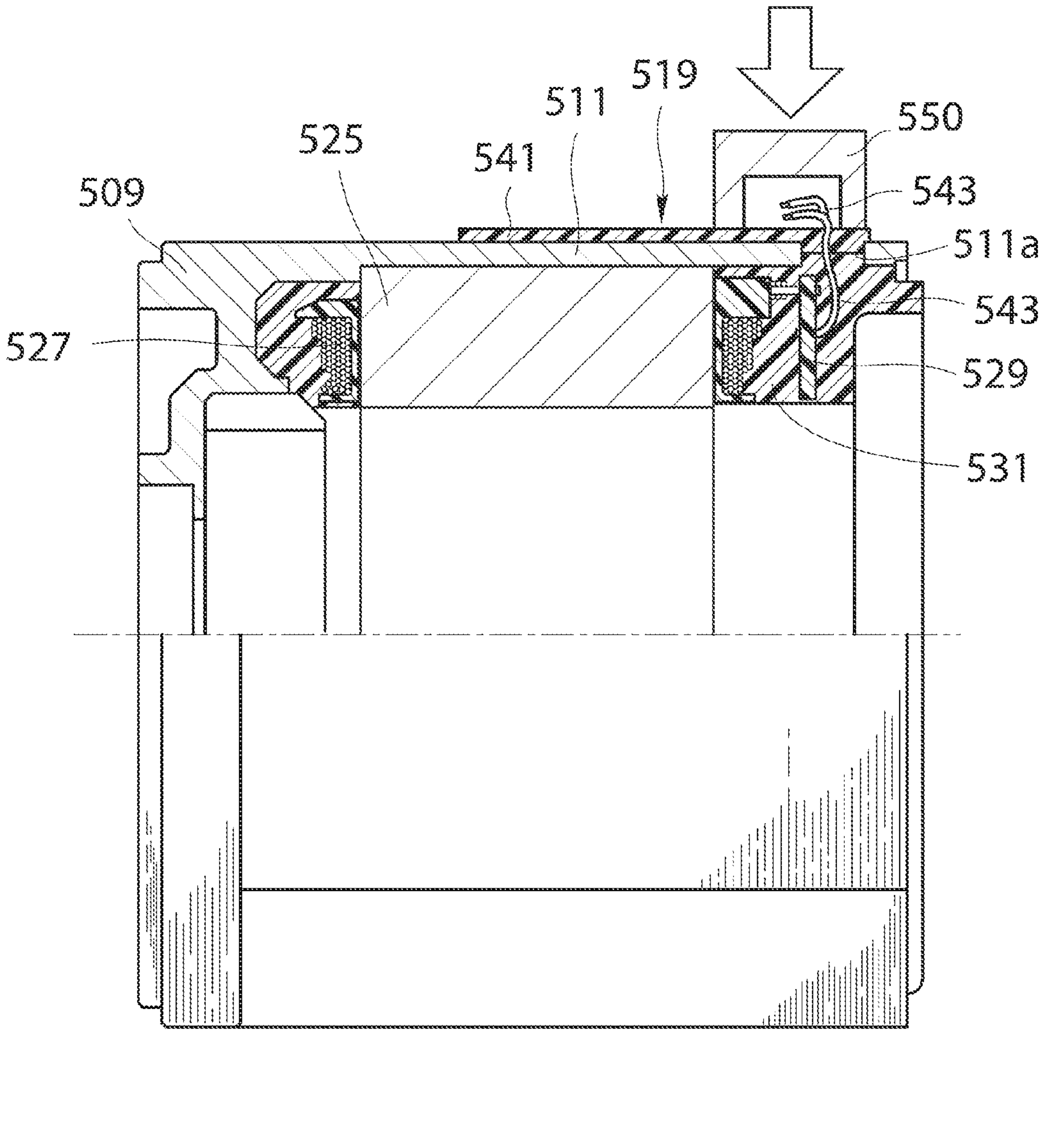
FIG. 15 is a partially cut-away front view of a stator for an electric apparatus, specifically, an electric motor provided with another connecting structure for electric cables according to yet another embodiment of the present invention.
Figure 16A:
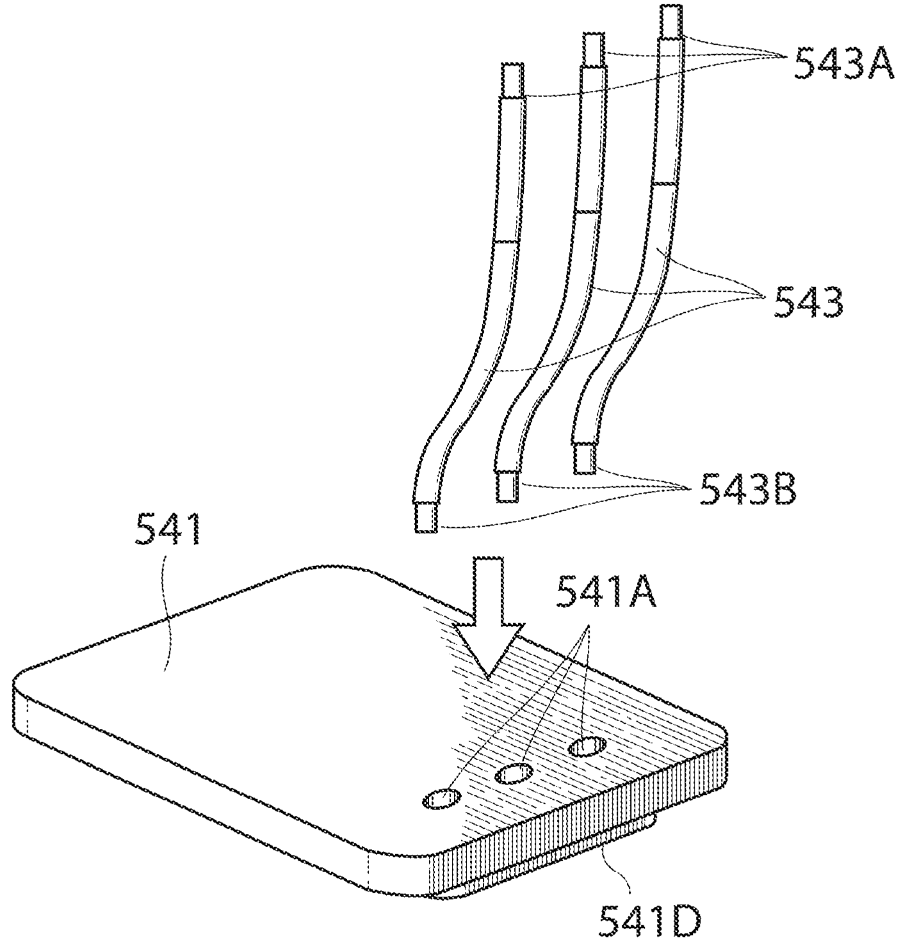
FIGS. 16A and 16B are perspective views illustrating respectively the connecting member attachment before and after three lead wire members are supported by the connecting member attachment.
Figure 16B:
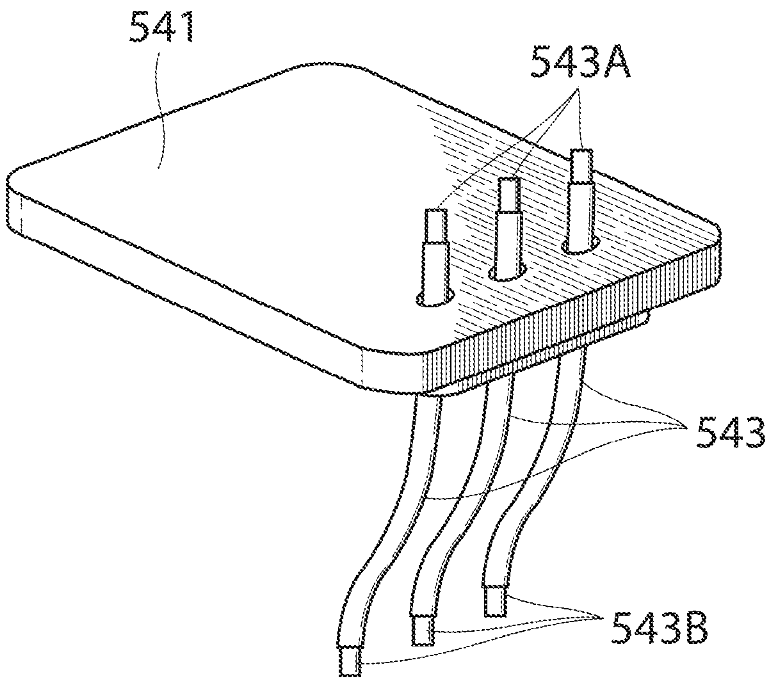

FIG. 15 is a partially cut-away front view of a stator for an electric apparatus, specifically, an electric motor provided with another connecting structure for electric cables according to yet another embodiment of the present invention. FIGS. 16A and 16B are perspective views illustrating respectively the connecting member attachment before and after three lead wire members 543 are supported by a connecting member attachment 541. The configuration of the stator for an electric motor illustrated in FIG. 15 except for a cable connecting unit is the same as that of the electric motor illustrated in FIGS. 1 to 4. Out of the parts or members illustrated in FIG. 15, those parts or members structurally similar to those illustrated in FIGS. 1 to 4 are allocated reference numerals or signs obtained by adding 500 to the reference numerals or signs shown in FIGS. 1 and 2, and accordingly the descriptions thereof are omitted.

As particularly illustrated in FIGS. 15 and 16, a cable connecting unit 519 used in the present embodiment includes the connecting member attachment 541 and three lead wire members 543 supported by the connecting member attachment 541. As illustrated in FIG. 16, the lead wire members 542 are each formed of an insulating coated electric cable having one end portion 543A connected to the core of an electric cable and the other end portion 543B connected to a circuit substrate 529 for connection provided on a side of the stator.

As illustrated in FIG. 16, the connecting member attachment 541 has three support fitting holes 541A for supporting the three lead wire members 543 with the three lead wire members 543 supported thereby. The connecting member attachment 541 is formed of an electrically insulating material such as fluororubber. Insulating coated portions of the three lead wire members 543 are pressed into the support fitting holes 541A. Alternatively, the connecting member attachment 541 may unitarily include a projecting portion 541D through which the support fitting holes 541A are formed. The projecting portion 541D is fitted into a through hole 511*a* formed in a cylindrical portion 511 of a casing 513. When forming a molded portion 531, the connection member attachment 541 is pressed onto the cylindrical portion 511 of the casing 513 with a pressing tool 550 illustrated in FIG. 15. Then, the stator is placed in a mold with the connecting member attachment pressed onto the cylindrical portion 511, and a resin is filled into the stator. The use of the connecting member attachment 541 thus obtained allows the support of the lead wire members 543 simply by fitting the lead wire members 543 in the support fitting holes 541A.

Figure 17:
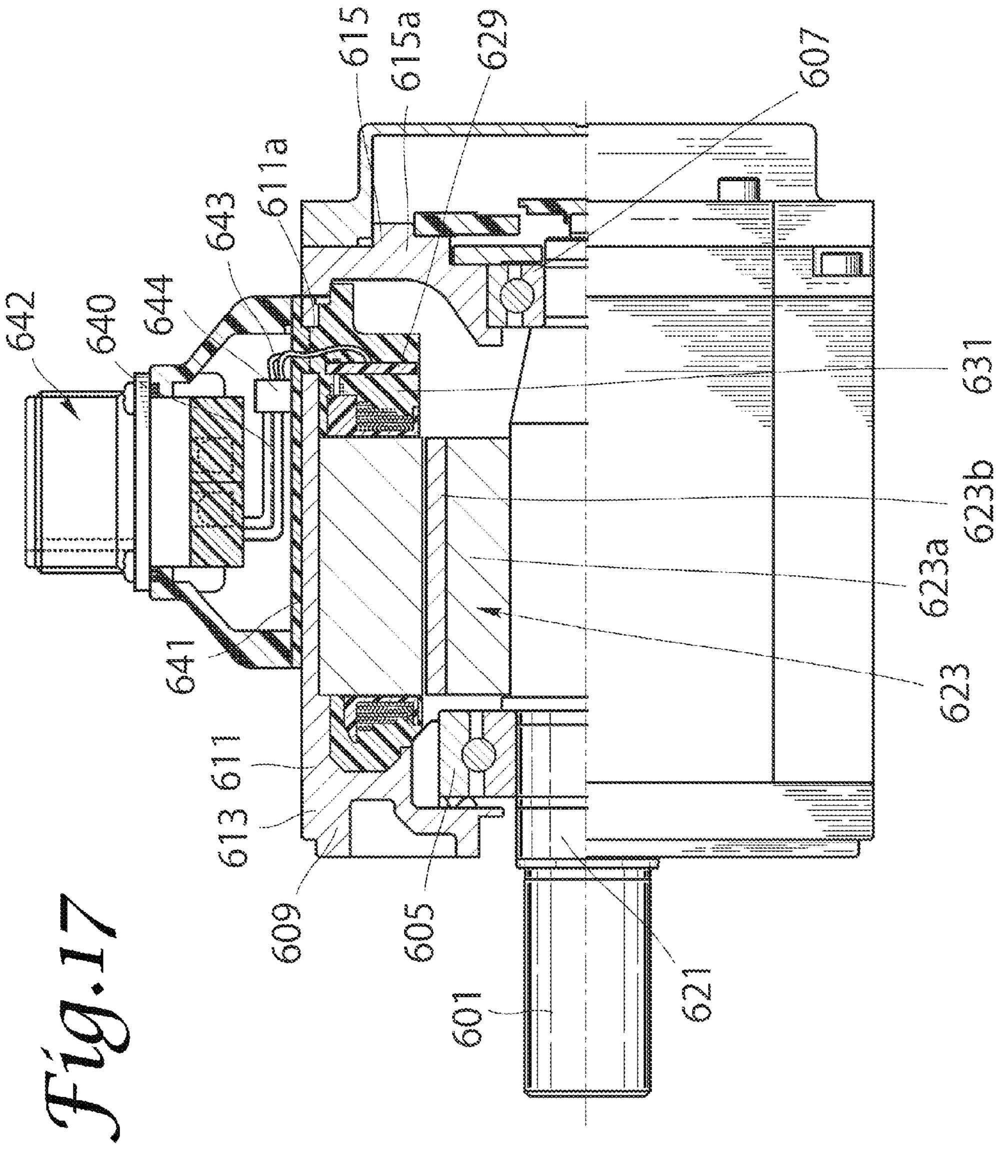
FIG. 17 is a half cross sectional view of a cable connecting unit provided with a cannon plug for facilitating and securing the connection of cables according to still another embodiment of the present invention.

FIG. 17 is a half cross sectional view of a cable connecting unit 619 provided with a cannon plug 642 for facilitating and securing the connection of cables according to still another embodiment of the present invention. In FIG. 17, those parts or members structurally similar to those illustrated in FIGS. 1 to 4 are allocated reference numerals or signs obtained by adding 600 to the reference numerals or signs shown in FIGS. 1 and 2, and accordingly the descriptions thereof are omitted. The stator of the present embodiment is provided with the cable connecting unit which has substantially the same structure as the cable connecting unit 519 of the embodiment shown in FIG. 15 except that the cannon plug 642 is fixed to the cable connecting unit in the present embodiment. A plurality of terminals, not illustrated, provided in the cannon plug 642 are connected to the cores of a plurality of lead wires 640. The core materials of the lead wires 640 and the core materials of lead wire members 643 are connected by using a pressure bonding sleeve 644. A cylindrical base 642*b* of the cannon plug 642 is attached onto a connecting member attachment 641 by some means such as ultrasonic adhesion.

According to the present invention, a connecting member, which is disposed not to move with respect to a casing, is used to electrically connect an electric apparatus unit and a plurality of electric cables, thereby securing the connection between the electric apparatus unit and the electric cables with a low-priced connecting structure. Further, a connecting member attachment may be molded using a commercially available receptacle as an insert.

While certain features of the invention have been described with reference to example embodiments, the description is not intended to be construed in a limiting sense. Various modifications of the example embodiments, as well as other embodiments of the invention, which are apparent to persons skilled in the art to which the invention pertains, are deemed to lie within the spirit and scope of the invention.

What is claimed is:

1. A connecting structure for electric cables configured to electrically connect an electric apparatus unit disposed inside a casing and a plurality of electric cables disposed outside the casing, the connecting structure comprising:

a connecting member for electrically connecting the electric apparatus unit and the plurality of electric cables, the connecting member being disposed to pass through a wall portion of the casing in a thickness direction of the wall portion and not to move with respect to the casing: wherein:

the connecting member includes a circuit substrate having a connection circuit pattern formed thereon for electrically connecting the electric apparatus unit and the plurality of electric cables;

the electric apparatus unit includes a circuit substrate having a connection circuit pattern, the circuit substrate of the electric apparatus unit being partially opposed to the circuit substrate of the connecting structure; and the connection circuit pattern of the circuit substrate of the connecting structure and the connection circuit pattern of the circuit substrate of the electric apparatus unit are electrically connected via an electrically connecting component.

2. The connecting structure for electric cables according to claim 1, further comprising:

a connecting member attachment configured to be attached to the wall portion of the casing with the circuit substrate supported thereby.

3. The connecting structure for electric cables according to claim 2, wherein the connecting member attachment is molded of an electrically insulating resin using the circuit substrate as an insert.

4. The connecting structure for electric cables according to claim 2, further comprising a receptacle electrically connected to the circuit substrate, wherein:

the connecting member attachment is molded of an electrically insulating resin using the circuit substrate and the receptacle as inserts.

5. The connecting structure for electric cables according to claim 1, wherein:

the electrically connecting component includes a plurality of electrically conductive pin members each extending in a direction orthogonal with the circuit substrate of the electric apparatus unit and electrically connected to the connection circuit pattern of the circuit substrate of the electric apparatus unit;

the circuit substrate of the connecting structure has a plurality of through holes formed therein for allowing the electrically conductive pin members to be inserted thereinto; and end portions of the electrically conductive pin members passing through the through holes are soldered to the connection circuit pattern of the circuit substrate of the connecting structure.

6. The connecting structure for electric cables according to claim 1, wherein:

a molded portion is formed of an electrically insulating resin inside the casing; and a portion of the connecting member, which is located inside the casing, is disposed in the molded portion.

7. An electric apparatus provided with a connecting structure for electric cables of claim 1 for use with power supply cables.

* * * * *